United States Patent [19]

Schonstedt

[11] Patent Number: 4,590,425
[45] Date of Patent: May 20, 1986

[54] MAGNETIC DETECTOR APPARATUS WITH EXCITATION CONDUCTORS CONNECTED IN SERIES VIA SENSOR HOUSING

[75] Inventor: Erick O. Schonstedt, Reston, Va.

[73] Assignee: Schonstedt Instrument Company, Reston, Va.

[21] Appl. No.: 714,439

[22] Filed: Mar. 21, 1985

Related U.S. Application Data

[62] Division of Ser. No. 391,441, Jun. 23, 1982, Pat. No. 4,539,522.

[51] Int. Cl.⁴ .................. G01R 33/02; H01R 11/22
[52] U.S. Cl. .................................. 324/244; 324/253; 324/260; 324/331; 324/252
[58] Field of Search .................. 324/244–261, 324/323, 338, 339, 345, 346, 331, 330

[56] References Cited

U.S. PATENT DOCUMENTS

| | | | |
|---|---|---|---|
| 2,642,479 | 6/1953 | Jones | 324/255 |
| 2,687,507 | 8/1954 | Schonstedt | 324/246 |
| 2,966,853 | 1/1961 | Gilfillan, Jr. et al. | 324/245 X |
| 2,975,360 | 3/1961 | Bell | 324/244 |
| 3,050,679 | 8/1962 | Schonstedt | 324/245 |
| 3,249,857 | 5/1966 | Simon-Suisse | 324/239 |
| 3,281,660 | 10/1966 | Studenick | 324/326 |
| 3,425,648 | 2/1969 | Wipff et al. | 244/179 |
| 3,464,044 | 9/1969 | Strauss | 324/234 X |
| 3,736,502 | 5/1973 | Schonstedt | 324/253 |
| 3,790,882 | 2/1974 | Sharro | 324/224 X |
| 3,909,704 | 9/1975 | Schonstedt | 324/254 X |
| 3,961,245 | 6/1976 | Schonstedt | 324/245 |
| 3,982,179 | 9/1976 | Forster | 324/254 X |
| 4,110,689 | 8/1978 | Schonstedt | 324/254 |
| 4,139,950 | 2/1979 | Zuvela | 324/255 X |
| 4,258,320 | 3/1981 | Schonstedt | 324/262 |
| 4,292,590 | 9/1981 | Wilson | 324/244 X |
| 4,384,253 | 5/1983 | Förster | 324/253 X |
| 4,388,592 | 6/1983 | Schonstedt | 324/253 X |

Primary Examiner—Gerard R. Strecker
Assistant Examiner—Warren S. Edmonds
Attorney, Agent, or Firm—Shapiro and Shapiro

[57] ABSTRACT

Magnetic detector apparatus comprises a pair of electrically matched magnetic sensor assemblies supported at opposite ends of a titanium sensor tube of significant length. The sensor tube is supported in a liquid bath so as to resist gravitational forces tending to distort the sensor tube and thereby misalign the magnetic axes of the sensors. The excitation conductors of the sensors are connected in series with an electrically conducting path formed through the sensor tube by spider members in electrical contact with the tube interior and connected to the respective excitation conductors.

4 Claims, 3 Drawing Figures

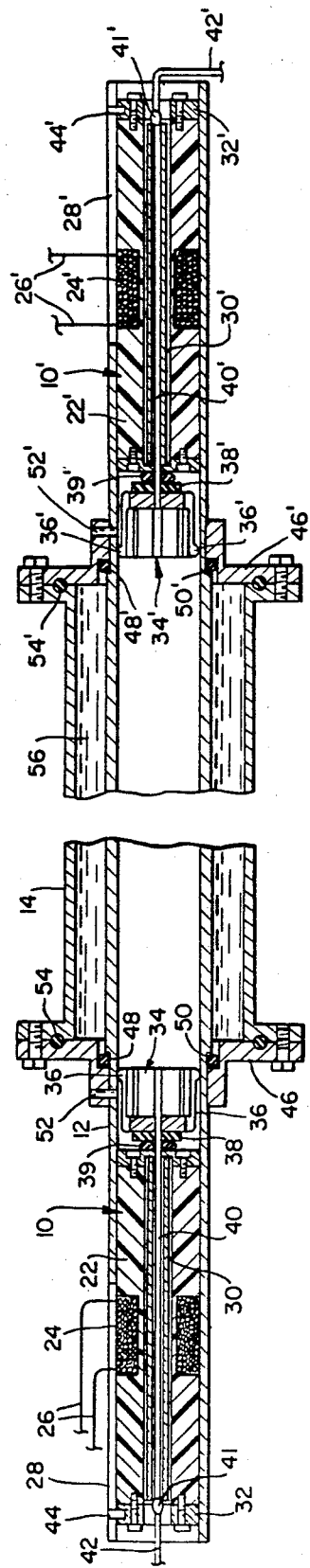
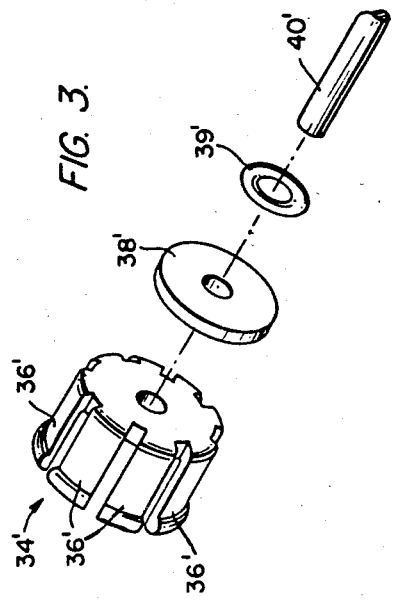
FIG. 2.
FIG. 3.

1

MAGNETIC DETECTOR APPARATUS WITH EXCITATION CONDUCTORS CONNECTED IN SERIES VIA SENSOR HOUSING

This is a divisional patent application of U.S. Ser. No. 391,441, filed June 23, 1982, now U.S. Pat. No. 4,539,522.

BACKGROUND OF THE INVENTION

This invention relates to magnetic detector apparatus, such as saturable core (fluxgate) magnetic locators or gradiometers.

In magnetic detector apparatus of the type referred to, two electrically matched field-sensing elements are mounted on a non-magnetic structure such that their magnetic axes are, theoretically, precisely parallel or coaxial. The output signals of the two sensors are arranged so that they oppose each other. If the structure is oriented in any direction in a uniform magnetic field, the field components at each sensor are equal, so that there is no resulting output signal from the combination of sensors. If, however, a magnetic object exists within the detection range of the instrument, the magnetic field will generally be stronger at one of the sensors than at the other sensor, so that a net difference output signal will be produced by the combination indicative of the presence of the object. Apparatus of this type is shown, for example, in applicant's prior U.S. Pat. No. 3,961,245.

Accurate operation of detector apparatus as described is generally dependent upon substantially precise alignment of the magnetic axes of the respective sensors. While the alignment may be relatively accurately set in manufacture, the accuracy may deteriorate with use, due for example to creep in the sensor supporting structure, and while various misalignment compensation techniques are known, these can only be employed if a user has access to alignment testing equipment. Accordingly, it is clearly desirable in magnetic detector apparatus of the type described, for the sensor support structure to be constructed in a manner which can resist the tendency for misalignment to occur in the sensor magnetic axes. The present invention is concerned, inter alia, with this aspect of magnetic detector apparatus design.

The problem of possible sensor misalignment, as described above, increases with the length of the detector apparatus. (The farther apart the pair of sensors are positioned, the more accurate is the instrument.) The present invention is also concerned with the provision of sensor support structure which can maintain reasonable alignment accuracy of a pair of sensor assemblies which are significantly spaced apart, e.g., in an instrument of the order of 15 feet in length.

The invention is further concerned with a novel means for providing an electrical conducting path between the excitation conductors of a pair of sensor assemblies in magnetic detector apparatus of the type described.

SUMMARY OF THE INVENTION

In accordance with one aspect of the invention, magnetic detector apparatus includes a pair of magnetic sensor assemblies, and a sensor tube in which the assemblies are supported in axially spaced positions, wherein the sensor tube is a titanium tube, titanium being a non-magnetic material which is more stable and less subject to creep than other non-magnetic materials commonly used for this purpose, for example, aluminum or plastics.

In accordance with another aspect of the invention, magnetic detector apparatus includes a sensor tube in which a pair of magnetic sensors are supported in axially spaced positions, the sensor tube itself being supported over at least a part of its length in a liquid, so as to resist distortion of the tube due to gravitational forces. For example, the sensor tube may be enclosed in a support tube which provides a longitudinally extending annular cavity around the sensor tube, the cavity being filled with the liquid. The support tube may be carried in an outer tube, and the liquid may be a high viscosity oil or silicone fluid having a viscosity of the order of 200 to 1,000 centistokes.

In accordance with yet a further aspect of the invention, magnetic detector apparatus includes a pair of magnetic sensor assemblies, and non-magnetic electrically conducting sensor support means, such as a sensor tube, supporting the assemblies in spaced apart relation, each sensor assembly including a signal winding, a magnetic core, and an excitation conductor for the core, wherein an electrically conducting path for connecting the respective excitation conductors in series is provided by the sensor support means. The sensor assemblies may, for example, each be provided with an electrically conducting spider having fingers which provide electrical contact with the support means, and an elongate central element electrically connected to the spider which extends axially through the sensor core and forms the excitation conductor. This aspect of the invention obviates the necessity of having electrical wiring extending lengthwise through a sensor support tube in order to electrically connect the sensor assemblies. This is of particular advantage in instruments of significant length.

Other features of the invention will become apparent from the ensuing description and claims in conjunction with the accompanying drawings.

BRIEF DESCRIPTION OF THE DRAWINGS

FIG. 2 is an enlarged longitudinal sectional view of a sensor tube and a sensor support tube used in the gradiometer, the figure illustrating a pair of spaced sensor assemblies; and FIG. 3 is an exploded perspective view of a spider member used in conjunction with one of the sensor assemblies.

DESCRIPTION OF THE PREFERRED EMBODIMENT

Figure 1:
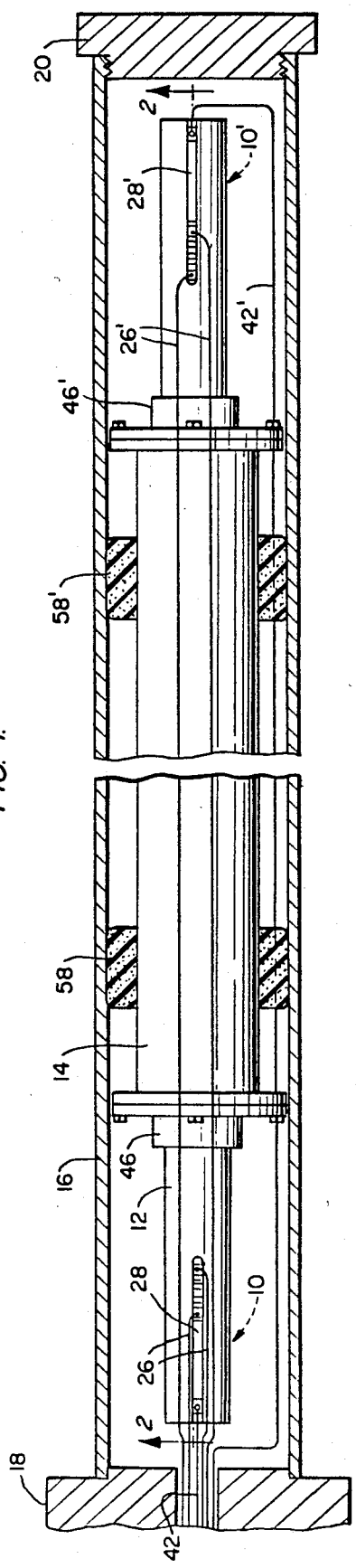
FIG. 1 is a longitudinal sectional view of a magnetic gradiometer in accordance with the invention.

Referring initially to FIGS. 1 and 2 in particular, the illustrated gradiometer includes a pair of electrically matched magnetic sensor assemblies 10, 10' (see FIG. 2) supported in opposite ends of a sensor tube 12 which is itself supported in a support tube 14 contained in an outer tube 16 (FIG. 1). A housing 18 at one end of the tube contains electric circuitry (not shown) connected to the sensor assemblies as will be described to provide an output signal, in known manner, if the sensors are out of balance, which may be indicative of the presence of a magnetic object in the range of sensitivity of the gradiometer. The other end of tube 16 is provided with an end cap 20.

The illustrated construction is particularly suited to gradiometers of significant length, e.g., the length of tubes 12 and 16 may be of the order of 15 feet. Gradiometers of this size are primarily intended for vehicular mounting (in a land vehicle, ship or aircraft) and will be provided with suitable mounting means, not shown. A more detailed description of the construction follows.

Each of the sensor assemblies 10, 10' may be of the type disclosed in the aforenoted U.S. Pat. No. 3,961,245, the disclosure of which is incorporated herein by reference, and which may be referred to for a more comprehensive description of the assemblies. As shown in FIG. 2, each sensor assembly includes a non-magnetic cylindrical bobbin 22, 22' carrying a signal winding 24, 24'. Signal winding leads 26, 26' extend through slots 28, 28' formed at opposite ends of tube 12, and connect with circuitry in housing 18. Internally, each of the respective bobbins 22, 22' is provided with an elongate magnetic core 30, 30' with a central bore for receiving an excitation conductor as will be described. Each bobbin may be provided with an adjustable end cap 32, 32', whereby the alignment of the magnetic axes of the sensors may be adjusted in the manner described in the aforesaid patent, so as to obtain coaxiality or parallelism of the axes.

In accordance with one aspect of the present invention, each sensor assembly is associated with an electrically conducting spider member 34, 34' comprising a cup-shaped member providing resilient fingers 36, 36'. The cup-shaped members are each a friction fit in tube 12, so that the resilient fingers 36, 36' make electrical contact with the tube. (Tube 12 is a non-magnetic electrically conducting tube as will be described.) Rod members 40, 40', which may be stiff electrical wire soldered centrally to the bases of the respective cup-shaped members, pass through the central bores in the cores 30, 30' to provide excitation conductors for the respective sensor assemblies. Insulating plates 38, 38' and O-rings 39, 39' may be interposed between the bases of the respective cup-shaped members and the ends of the sensor assemblies. The free ends of rod members 40, 40' may be flattened to form electrical terminals 41, 41' and to hold the sensor assemblies in place. The free ends may be connected to excitation leads 42, 42' connected to the circuitry in housing 18. Spider members 34, 34' may, for example, be made of gold-plated berillium copper. Removable pins 44, 44' may be used to locate and secure the sensor assemblies in tube 12.

It will be appreciated that with the above arrangement, an electrically conducting path for connecting the excitation conductors in series is formed through tube 12 via the fingers 36, 36' of the respective spider members. This obviates the need for electrical wiring extending internally along the length of tube 12, which is an advantage particularly in instruments of significant length, i.e., wherein the distance between the spider members 34 and 34' is large compared to the length of the excitation conductors 40, 40'. Additionally, while signal winding and excitation leads are shown extending from the distal end of the apparatus into the electric circuitry of housing 18, it may be possible to use support tube 14 to form a return conducting path for either the excitation winding or the relevant signal winding, with tube 14 being formed from a suitable non-magnetic electrically conducting material, e.g., aluminum, and being insulated from tube 12.

Flanged collars 46, 46' are positioned on tube 12, with O-ring seals 48, 48' adjacent shoulders 50, 50' formed in the tube. Pins 52, 52' may be used to locate and secure the collars to tube 12. Alternatively, the collars may be shrunk onto tube 12, which obviates the need for seals and pins. Tube 14 has flanged ends which are connected to collars 46, 46' by screws or the like, with interposed O-ring seals 54, 54'.

Tube 14 forms an annular space 56 around tube 12, which, in accordance with a further aspect of the invention, is filled with high viscosity oil or silicone fluid, e.g., of a viscosity in the order of 200–1,000 centistokes. (A suitable filling opening, not shown, may be provided in tube 14.) Also, tube 12, in accordance with yet another aspect of the invention, is preferably made of titanium, which is a highly stable electrically conducting, non-magnetic material less subject to creep than other non-magnetic materials such as aluminum or plastic. Tube 14 may itself be supported in outer tube 16 by foam sleeves 58, 58', which may be of the type disclosed in applicant's prior U.S. Pat. No. 4,258,320 incorporated herein by reference. Outer tube 16, housing 18, and end cap 20 may be made of a suitable non-magnetic material, e.g., aluminum.

By supporting the sensor assemblies in a titanium tube which is itself supported over a major part of its length in a bath of liquid, thereby supporting the tube against sagging, good protection against misalignment of the sensor axes is provided.

Parts of the gradiometer, such as its electrical circuitry, which are not described herein, form no part of the present invention. It will be understood that the nondescribed parts of the apparatus may be of conventional form.

While only a preferred embodiment of the invention has been described herein in detail, the invention is not limited thereby and modifications may be made within the scope of the attached claims. For example, while tubes 12, 14 and 16, may in the illustrated embodiment be of circular cross-section, housing members (tubes) of other cross-sectional shapes may be used for any of these elements.

What is claimed is:

1. Magnetic detector apparatus including a pair of magnetic sensor assemblies and a non-magnetic electrically conducting sensor housing supporting the assemblies in spaced apart relation, each sensor assembly including a signal winding, a magnetic core, and an excitation conductor extending along the core for exciting the same, wherein the excitation conductors are connected in series by conducting path means including the sensor housing, and wherein the excitation conductors are electrically connected to the housing at points that are separated by a large distance compared to the length of each excitation conductor.

2. Apparatus as defined in claim 1, wherein the sensor housing comprises a titanium tube.

3. Apparatus as defined in claim 1, wherein the conductive path means includes a pair of spider members within the housing, each in electrical contact with the housing and being connected respectively to the excitation conductors of the respective sensor assemblies.

4. Apparatus as defined in claim 3, wherein each spider member comprises a cup-shaped member of resilient fingers engaging the housing to provide the electrical contact and wherein each excitation conductor comprises a rod member connected to the cup-shaped member.

* * * * *